(12) United States Patent
Cutter et al.

(10) Patent No.: US 7,443,648 B2
(45) Date of Patent: Oct. 28, 2008

(54) DRIVER FOR INDUCTIVE LOAD

(75) Inventors: John R. Cutter, Macclesfield (GB); Brendan P. Kelly, Stockport (GB)

(73) Assignee: NXP, B.V., Eindhoven (NL)

( * ) Notice: Subject to any disclaimer, the term of this patent is extended or adjusted under 35 U.S.C. 154(b) by 413 days.

(21) Appl. No.: 10/552,904

(22) PCT Filed: Apr. 8, 2004

(86) PCT No.: PCT/IB2004/001157

§ 371 (c)(1),
(2), (4) Date: Oct. 12, 2005

(87) PCT Pub. No.: WO2004/093319

PCT Pub. Date: Oct. 28, 2004

(65) Prior Publication Data

US 2006/0227487 A1    Oct. 12, 2006

(30) Foreign Application Priority Data

Apr. 15, 2003  (GB) ................................ 0308674.1

(51) Int. Cl.
*H01H 47/00* (2006.01)
*H01H 9/00* (2006.01)

(52) U.S. Cl. ..................................................... 361/139
(58) Field of Classification Search .................. 361/139
See application file for complete search history.

(56) References Cited

U.S. PATENT DOCUMENTS

| 4,929,884 | A | * | 5/1990 | Bird et al. | .................... 323/313 |
| 5,420,532 | A | * | 5/1995 | Teggatz et al. | ............... 327/365 |
| 5,767,562 | A | * | 6/1998 | Yamashita | ................... 257/500 |
| 6,005,763 | A | * | 12/1999 | North | ......................... 361/154 |
| 2004/0160725 | A1 * | | 8/2004 | Gu | .............................. 361/152 |
| 2004/0260501 | A1 * | | 12/2004 | Fey et al. | ..................... 702/117 |

FOREIGN PATENT DOCUMENTS

DE              100 50 287              5/2002

* cited by examiner

*Primary Examiner*—Ronald W Leja
(74) *Attorney, Agent, or Firm*—Peter Zawilski

(57) ABSTRACT

A driver for an inductive load such as a solenoid coil 92 includes three FETs 4,6,8. Two of the FETs are reversely connected between battery and output terminals 16, 18, and one of the FETs is connected between output and ground terminals 16, 14. A driver circuit 10 having high and low side control circuitry 58,56 is formed in a common substrate with two of the FETs 4,6. In use, a coil 92 is connected to the output terminal 16, and driven in an energize mode in which current in the coil 92 is built up as indicated by arrow 100, a freewheel mode in which current circulates freely as indicated by arrow 102, and then may be switched off. The reversely connected FETs allow both short circuits to be prevented in the energize mode and allow the coil to be rapidly switched off. In spite of the control circuitry being formed in a common substrate with some of the FETs, the arrangement allows the FETs to be properly driven.

18 Claims, 1 Drawing Sheet

DRIVER FOR INDUCTIVE LOAD

Figure 1:
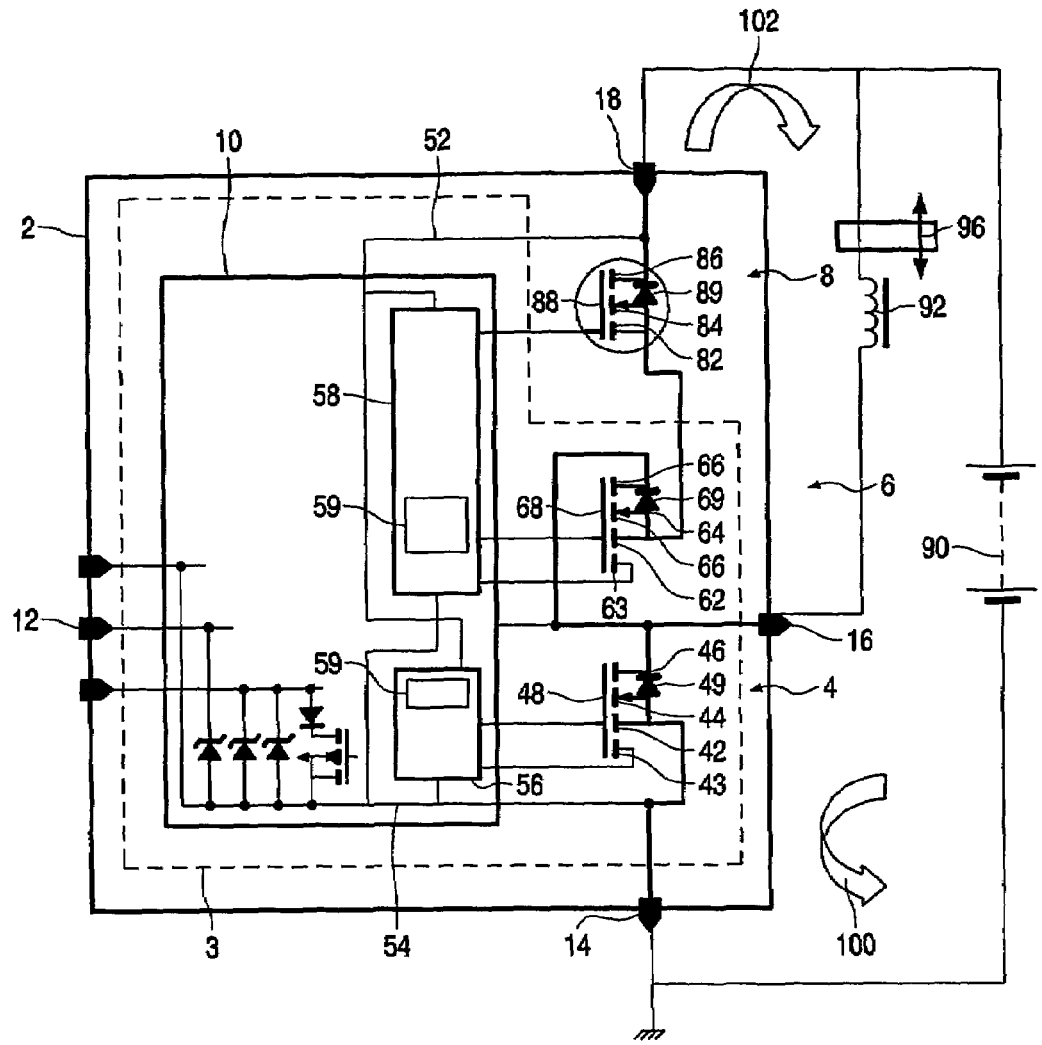

The invention relates to a driver for an inductive load, a method of operation of such a driver and a method of manufacture of a driver. In particular, but not exclusively, the invention relates to a solenoid driver.

There are a number of applications for drivers for an inductive load. For convenience, such inductive loads will be referred to in the following as "coils". Of particular relevance is the need to drive automotive solenoids having a mechanical actuator actuated by the coil, especially the electromechanical control valves of automatic transmission.

A driver for these applications needs to be able to operate in three modes. In a first mode, called "energise mode" in the following, the driver must be able to energise the coil with low losses in the driver, to supply as much as possible of the available supply voltage to the coil as quickly as possible. In the case of automotive solenoids, such rapid energising is required to actuate the mechanical output quickly.

In a second mode, the freewheel mode, the driver must be able to allow the coil current to recirculate or freewheel, also with low losses in the driver, so that the coil current decays slowly.

In a third mode, the ring-off mode, the driver must be able to allow the coil energy to be quickly dissipated in order to de-actuate the mechanical output quickly.

In use, the driver is used in the first mode to energise the coil quickly to activate its mechanical output. After a short time, the system changes to a pulse width modulation (PWM) scheme in which the driver is alternated between energise and freewheel modes. In this way, the system reduces the average coil current and power dissipation whilst retaining the mechanical actuator position.

When it is required to return the actuator to the rest position the driver commutates the current into a high-voltage clamp to quickly absorb the stored energy of the coil.

Prior art drivers may include separately packaged MOSFET, bipolar diode and control integrated circuits (ICs).

The only integrated solution known to the inventors is a Bipolar CMOS DMOS (BCD) device integrating control circuits, a low-side MOSFET output stage to energise the coil, and an NPN bipolar transistor. Disadvantages of this approach include the high manufacturing cost of the BCD process and substantial losses in the bipolar transistor in freewheel mode.

According to the invention there is provided a driver, comprising: a battery terminal and a ground terminal for connection to a voltage battery output and a ground battery output, respectively; an output terminal for driving a coil; an energise FET having a source, a gate and a drain; a control FET having a source, a gate and a drain; and a freewheel FET having a source, a gate and a drain, wherein the energise FET is connected with source and drain between the output terminal and the ground terminal, and the control FET and freewheel FET are connected in series between the battery terminal and the output terminal, the FETs being reversely connected with their sources and drains of opposite polarity.

The inventors have realised that two FETs in series, the control FET and the freewheel FET, can effectively act to block current transport in each direction to prevent a short circuit through the control and freewheel FETs during the energise mode and to switch off the coil during the ring-off mode. This is achieved by connecting the FETs in series so that current flowing through the FETs in series passes in the drain-source direction in one FET and the source-drain direction in the other. Any body-drain diode linking source and drain permits current to flow in one direction when the FET is switched off. Accordingly, by using two FETs in series connected in reverse only one of the diodes will conduct current and so the pair of FETs can cooperate to switch off current.

Further, the inventors have realised that such a circuit allows the energise and control FETs to be integrated on a common substrate, the drains connected in common to the output.

The invention offers advantages over solutions involving a BCD device. Firstly, in such a prior art device the losses in the freewheel mode are dominated by the bipolar saturation voltage which cannot easily be reduced. In contrast, the FET technology used in the present invention avoids this problem. Secondly, bipolar transistors also tend to be less suitable for absorbing high levels of energy when the coil is de-energised.

The inventors have considered a number of options for an integrated solenoid driver, and have deviated from traditional implementations of high and low side FETs. A useful reference for the state of the art of FETs integrated with drivers is contained in Philips Application Note AN01048, "PIP3 TOPFETs for industrial automation".

In a traditional high-side n-channel FET device, the substrate is connected to the positive supply for integrated CMOS control circuitry. Such CMOS technology allows the cost effective implementation of many circuit functions such as charge pumps integrated with a high-side driver FET. The drain of the FET is the substrate, and the source acts as the output. Further, such high-side n-channel devices can have multiple source outputs on a single chip, because the common drain is connected to the positive battery supply. The Philips Semiconductors product BUK218-50DY is of this type.

In a traditional low-side n-channel FET device, the drain of the high side driver FET is again the substrate. In the case of a low-side device, the drain is the output terminal which is sometimes at or close to ground potential. This means that an additional positive power supply input needs to be provided to power any control circuitry. Further, if the control circuitry is to be self isolating it is necessary to use only n-channel MOS technology and n-channel resistors, because p-type components would not be isolated when the output and hence the substrate was close to ground potential. Although it is harder to implement control circuitry using only n-channel devices without the flexibility offered by CMOS, it is possible. Philips devices such as BUK101-50DL and BUK120-50DL are of this type.

It is not possible to integrate multiple outputs in such a low side device because the drain outputs would be connected together by the common substrate.

These implications mean that traditionally high side circuits have not been combined with low side circuits because the low side circuits rely on a positive substrate potential for self-isolation.

The inventors have however realised that in the configuration envisaged in the present case it is possible to integrate CMOS logic circuits with both high and low side FETs. In particular, the control circuitry can use traditional high-side charge pump techniques when the low-side device is off and the drain voltage is pulled high. Accordingly, the driver may integrate CMOS control circuitry in the common semiconductor substrate, the control circuitry being connected to the gates of the energise, control and freewheel FETs to control the FETs.

The control circuitry is preferably arranged to switch the FETs between an energise mode in which the energise FET is on and the freewheel FET is off, a freewheel mode in which the energise FET is off and both the control and freewheel FETs are off and a ring-off mode in which the energise FET is off and the control FET is off.

In a preferred arrangement the source of the energise FET is connected to the ground terminal and the drain is connected to the output terminal; the drain of the control FET is connected in common with the drain of the energise FET to the output terminal; and the drain of the freewheel FET is connected to the battery terminal and the source is connected to the source of the control FET.

The FETs may each be n-type. N-type FETs offer lower loss for a given cost and so allow for the most cost effect device possible.

The common semiconductor substrate may integrate a "smart power" chip and the freewheel FET may be a trench MOSFET. By a "smart power" chip is meant a transistor having integrated temperature and overload protection. In particular, the "smart power" chip may be a Philips "TOPFET" or "Temperature and Overload Protected Field Effect Transistor" device.

The invention also relates, in another aspect, to a coil control circuit, comprising a driver as set out above; a battery having a voltage battery output connected to the battery terminal of the driver and a ground battery output connected to the ground terminal of the driver; and a coil connected between the output terminal of the driver and the voltage battery output.

In a particularly preferred application, the coil is a solenoid actuator having a mechanical actuator actuated by current in the coil.

In another aspect, there is provided a driver, comprising: a battery terminal and a ground terminal for connection to a voltage battery output and a ground battery output respectively; an output terminal for driving a coil; high and low side driver FETs integrated in a common substrate and connected between the battery terminal and the output terminal and the ground terminal and the output terminal respectively; high-side control circuitry capable of operation when the voltage on the common substrate is at least 1V above the voltage on the ground terminal integrated in the common semiconductor substrate and connected to the gates of the high side driver FET or FETs to control the high side driver FET or FETs; and low-side control circuitry capable of operation even when the voltage on the common substrate is close to the voltage on the ground terminal integrated in the common semiconductor substrate and connected to the gates of the low side driver FET or FETs to control the low side driver FET or FETs.

An additional FET or FETs may be provided, not integrated into the common semiconductor substrate but insulated from the common semiconductor substrate.

The high side circuitry preferably operates with a significant substrate voltage, preferably at least 1V further preferably 2V or even 5V. The low side circuitry should be capable of operation with substrate voltages below 1V.

The invention also relates to a method of operation of a circuit, including providing a coil control circuit having a coil, a battery having positive and negative outputs, and a driver, the driver having an output terminal connected through the coil to a first one of the battery outputs, an energise FET connected between the output terminal and the other one of the battery outputs; and control and freewheel FETs of the like conductivity type sources connected together and drains connected to the output terminal and the first one of the battery output respectively. The method includes switching to an energise mode in which the energise FET is on and the freewheel FET is off to energise the coil; switching to a freewheel mode in which the energise FET is off and both the control and freewheel FETs are off to retain the coil energised; and switching to a ring-off mode in which the energise FET is off and the control FET is off to de-energise the coil.

Figure 2:
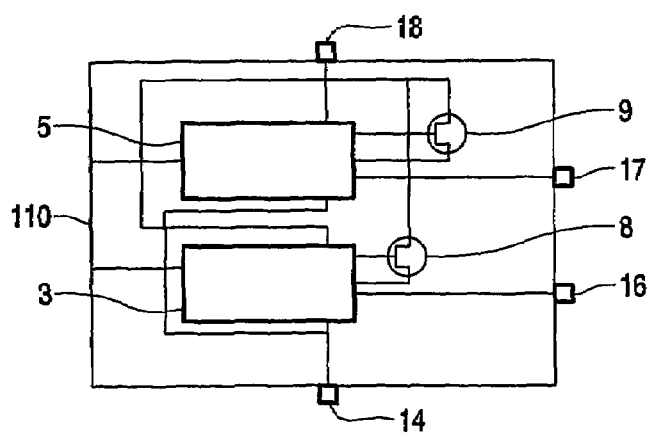

Embodiments of the invention will now be described, purely by way of example, with reference to the accompanying drawings, in which:

FIG. 1 shows a driver in a circuit according to a first embodiment of the invention; and FIG. 2 shows a second embodiment of the invention having a pair of drivers.

A driver 2 includes three n-type driver field effect transistors (FETs), namely an energise FET 4, a control FET 6, a freewheel FET 8. The driver also includes control circuitry 10. The driver has control inputs 12, and three power terminals, namely a battery terminal 18, a ground terminal 14 and an output terminal 16.

The energise FET 4 has a dual source 42,43, a body 44, a drain 46 and a gate 48, the drain 46 being formed in a common substrate 3 such that a body-drain diode 49 connects source and drain. The control FET 6 is substantially identical: it has a dual source 62,63, a body 64, a drain 66 and a gate 68, the drain 66 being formed in the common substrate 3 such that a body-drain diode 69 connects source and drain. The driver circuit 10 is formed in the same common substrate.

The freewheel FET 8 also has a source 82, a body 84, a drain 86 and a gate 88, together with a source drain-diode 89. However, the body and drain of the freewheel FET are isolated from the common substrate 3. In the preferred embodiment this is done by forming a separate freewheel FET 8 as a discrete device and simply including it in the same package. Alternatively, the isolation of the freewheel FET 8 may be done by isolating a region of a semiconductor substrate and forming the freewheel FET 8 in the isolated region.

The energise 4 FET is connected as a low-side FET between the output terminal 16 and the ground terminal 14 with its drain 46 connected to the output terminal 16, and its source 42 connected to the ground terminal 14. The gate 48 is connected to and controlled by the control circuitry 10, and the second source 43 is likewise connected to the control circuitry 10.

The control FET 6 and the freewheel FET 8 are connected in series between the battery terminal 18 and the output terminal 16. The drain 86 of the freewheel FET 8 is connected to the battery terminal, and the source 82 of the freewheel FET 8 is connected to the source 62 of the control FET 6, the drain 66 of the control FET 6 being connected to the output terminal so that the series connected control and freewheel FETs 6, 8 are connected reversely. That is to say, current flowing through the FETs in series passes from source to drain in one of the FETs and from drain to source in the other of the FETs.

The gates 68, 88 of these control and freewheel FETs 6,8 are connected to the control circuitry. The second source 63 of the control FET 6 is likewise connected to the control circuitry.

The control circuitry has control inputs connected to the input terminals 12 and takes its power from a positive power rail 52 connected to the battery terminal 18 and ground power rail 54 connected to the ground terminal. The control circuitry has high-side control circuitry 58 for controlling the freewheel and control FETs 6, 8 and low-side control circuitry 56 for controlling the energise FET 4.

A further important feature of the circuit is that the gates of the control and freewheel FETs 6,8 only need to have their gates maintained above their gate voltages (to positively switch on the FETs) when the energise FET is off. In this state, the voltage at the output terminal 16 is pulled high through the coil 92 and so the drain voltage of the energise 4 and control 6 FETs is likewise pulled high. Thus, isolation of conventional circuits can be maintained. This means that the high side control circuitry 58 can be full CMOS, using typical high side charge pump circuitry, even though the circuitry is integrated with a low side FET 4.

Conversely, the low-side driver circuitry 56 should be implemented with n-MOS FETs and resistors because the voltage on the output terminal can be low when this transistor is switched on. If p-type circuitry were used in the low-side driver circuitry the p-type circuitry would not be properly isolated from the substrate. As will be appreciated by the skilled person, such n-MOS circuitry can be made by the same CMOS process used for the high-side CMOS circuitry by selecting only n-type devices from the p- and n-type devices available in CMOS.

It should be noted that the high-side circuitry 58 may include some parts implemented on low-side style NMOS circuits. In particular, the gates of the energise, control and freewheel FETs 4, 6, 8 should be NMOS to ensure that the gate can operate at a higher voltage than the substrate/drain.

Also, although the low-side circuitry 56 is generally required to be NMOS, it will be appreciated from the above that CMOS circuits may in alternative embodiments be used for those parts of the circuit only required to operate when the drain has a high enough positive voltage.

The skilled person will also realize that level shift circuits may be used to adapt voltage levels if required for the various circuits.

The driver may be used in a coil control circuit having a solenoid 92 connected between the battery 18 and the output 16 terminals and a power source, indicated as battery 90, connected between the battery 18 and ground 14 terminals. The solenoid includes mechanical actuator 96 that is normally in a deactivated position but may be moved by current passing through the solenoid 92 to an actuate position. In a particular application, the mechanical actuator 96 is mechanically connected to a control valve of an automatic vehicle transmission.

In use, the driver 2 cycles between three modes. Firstly, the energise FET 4 is turned on and the freewheel FET 8 turned off. Current flows from the battery 90 through the coil 92 and the energise FET 4 in the direction indicated by arrow 100. The tuned off freewheel FET 8 ensures that current does not short-circuit the coil 92 through the freewheel and control FETs 6, 8. In this mode the driver supplies as much as possible of the available supply voltage to the coil as quickly as possible. The current energises the solenoid 92 to actuate the mechanical actuator 96.

After the current in the coil has built up the control FET 6 may be switched on and the energise FET 4 switched off to give a freewheel mode. The energise FET 4 prevents current continuing to pass around the loop indicated by arrow 100, so the current in the coil will flow around the circuit indicated by arrow 102. The control 6 and freewheel 8 FETs are both low-loss n-type FETs so that the current decays only slowly. Periodically, the FETs can be switched back into the energise mode to top up the current, and then switched back into the freewheel mode, to keep sufficient current flowing through the coil to keep the mechanical actuator actuated.

When it is required to deactivate the actuator, the energise FET 4 is kept switched off and the control FET 6 is also switched off. In this mode, current in the coil decays rapidly to deactuate the mechanical actuator 96.

It will be noted that the freewheel and control FETs 6,8 need to block current travelling in the direction of arrow 102 to deactivate the actuator, but need to block current travelling in the opposite direction in the energise mode to prevent the coil 92 being short-circuited. Thus, if only one of the two FETs were present the body-drain diode present in the FETs would short-circuit in one of these two states. By using reversely oriented FETs in series, the FETs are able to block current passing in both directions.

A further feature of the control circuitry is that the control FET 6 is turned fully on during the energise mode—only the freewheel FET 8 needs to be off to prevent a short circuit. Then, on entering the freewheel mode, the freewheel FET 8 can be turned on very quickly by connecting the gates 68, 88 of the freewheel and control FET, 6, 8 in control circuit 10. The gate capacitance of the control FET 6 is accordingly preferably larger than that of the freewheel FET 8 to optimize this charge sharing.

This approach minimizes the switch time since it is not necessary to provide all the charge to switch on the FET 8 from a charge pump. The approach effectively bootstraps the freewheel FET 8 with the control FET 6.

It will be noted that the above description does not mention the control of each FET in each of the modes. This is because not all FETs need to be switched in each of the modes. For example, in the energise mode, the control FET 6 cannot prevent current shorting through the control and freewheel FETs in series, because the body-drain diode would allow current to flow whether the FET was on or off. Thus, so long as the freewheel FET 8 is off, the control FET 6 is not important. Likewise, to deactivate the current in the coil, only the control FET 6 needs to be off: the freewheel FET 8 cannot do this job because its body-drain diode could pass the current regardless of whether the freewheel FET 8 was on or off.

Suitable temperature control and over-voltage control circuitry 59 for the energise 4 and control 6 FETs is known and may be incorporated into the control circuitry 10. In this case, energise 4 and control 6 FETs may be referred to as "smart power" FETs. By using a more complex device (such as Philips' TrenchPLUS) for the freewheel FET 8 than the simple trench MOSFET proposed in the embodiment, suitable temperature control and over-voltage control circuitry may also be included in freewheel FET 8.

The use of only n-channel FETs as the driver FETs means that the circuit can be made to have a low total on-resistance in the freewheel mode and hence low losses. Nevertheless, the circuit is relatively cheap to make. Thus, a highly integrated driver can be made in a cost-efficient way.

In a second preferred embodiment, illustrated in FIG. 2, two such complete drivers are integrated into a single package 110. Two separate freewheel FETs 8,9 share a common battery terminal 18. A common ground terminal 14 is also provided. Separate output terminals 16, 17 are provided for two separate "smart power" chips 3, 5 including corresponding energise and control FETs formed on respective substrates.

Although the circuit has been described for the purposes of driving a solenoid for an automatic transmission there are many other applications for the approach. The circuit is suitable for driving other control valves and actuators, and indeed inductive loads in general.

From reading the present disclosure, other variations and modifications will be apparent to persons skilled in the art. Such variations and modifications may involve equivalent and other features which are already known in the design, manufacture and use of power semiconductor devices and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention.

The applicants hereby give notice that new claims may be formulated to any such features and/or combinations of such features during the prosecution of the present application or of any further applications derived therefrom.

The invention claimed is:

1. A driver, comprising:
a battery terminal and a ground terminal for connection to a voltage battery output and a ground battery output, respectively;
an output terminal for driving a coil;
an energise FET having a source, a gate and a drain;
a control FET having a source, a gate and a drain; and
a freewheel FET having a source, a gate and a drain,
wherein the energise FET is connected with source and drain between the output terminal and the ground terminal, and the control FET and freewheel FET are connected in series between the battery terminal and the output terminal, the sources and drains of the control and freewheel FETs being arranged reversely so that current flowing through the control and freewheel FETs in series flows from source to drain in one of the control and freewheel FETs and from drain to source in the other.

2. A driver according to claim 1, wherein the source of the energise FET is connected to the ground terminal and the drain is connected to the output terminal;
the drain of the control FET is connected in common with the drain of the energise FET to the output terminal; and
the drain of the freewheel FET is connected to the battery terminal and the source is connected to the source of the control FET.

3. A driver according to claim 1 comprising a common semiconductor substrate, wherein the drains of the control FET and the energise FET are formed in the common semiconductor substrate and the drain of the freewheel FET is isolated from the common semiconductor substrate.

4. A driver according to claim 3 further comprising control circuitry integrally formed in the common semiconductor substrate, the control circuitry having a high voltage power rail connected to the battery terminal and a low voltage power rail connected to the ground terminal for powering the control circuitry from the battery and ground terminals.

5. A driver according to claim 4 wherein the control circuitry includes:
high-side control circuitry integrated in the common semiconductor substrate and connected to the gates of the control and freewheel FETs to control the FETs; and
low-side control circuitry integrated in the common semiconductor substrate and connected to the gate of the energise FET to control the energise FET.

6. A driver according to claim 4, wherein the control FET is arranged to have a higher gate capacitance than the freewheel FET, and the control circuitry is arranged to turn the control FET fully on in the energise mode and, on switching from the energise mode to the freewheel mode, to connect the gates of the freewheel FET and the control FET together.

7. A driver according to claim 4 wherein the control circuitry further comprises temperature and voltage overload protection for protecting one or more of the energise FET, the control FET and the freewheel FET.

8. A driver according to claim 4 wherein the control circuitry is arranged to switch the FETs between an energise mode in which the energise FET is on and the freewheel FET is off, a freewheel mode in which the energise FET is off and both the control and freewheel FETs are on and a ring-off mode in which the energise FET is off and the control FET is off.

9. A driver according to claim 3 wherein the freewheel FET is a discrete FET formed in a separate semiconductor substrate.

10. A driver, comprising:
a battery terminal and a ground terminal for connection to a voltage battery output and a ground battery output, respectively;
an output terminal for driving a coil;
high and low side driver FETs integrated in a common substrate and connected between the battery terminal and the output terminal and the ground terminal and the output terminal, respectively;
high-side control circuitry capable of operation when the voltage on the common substrate is at least 1V above the voltage on the ground terminal integrated in the common semiconductor substrate, the high-side control circuitry being connected to the gates of the high side driver FET or FETs to control the high side driver FET or FETs; and
low-side control circuitry capable of operation even when the voltage on the common substrate is close to the voltage on the ground terminal integrated in the common semiconductor substrate, the low-side control circuitry being connected to the gates of the low side driver FET or FETs to control the low side driver FET or FETs.

11. A driver according to any preceding claim wherein the FETs are each n-type.

12. A coil control circuit, comprising:
a driver according to claim 1;
a battery having a voltage battery output connected to the battery terminal of the driver and a ground battery output connected to the ground terminal of the driver; and
a coil connected between the output terminal of the driver and the voltage battery output.

13. A coil control circuit according to claim 12 wherein the coil is a solenoid actuator having a mechanical actuator actuated by current in the coil.

14. A method of operation of a coil control circuit, comprising:
providing a coil control circuit having a coil, a battery having positive and negative outputs, and a driver, the driver having an output terminal connected through the coil to a first one of the battery outputs, an energise FET connected between the output terminal and the other one of the battery outputs; and control and freewheel FETs of the like conductivity type connected reversely in series between the output terminal and the first one of the battery output;
switching to an energise mode in which the energise FET is on and the freewheel FET is off to energise the coil;
switching to a freewheel mode in which the energise FET is off and both the control and freewheel FETs are on to retain the coil energised; and
switching to a ring-off mode in which the energise FET is off and the control FET is off to de-energise the coil.

15. A method according to claim 14 further including switching the control FET fully on in the energise mode and, on switching to the freewheel mode from the energise mode, connecting the gates of the freewheel and control FETs together to share charge to switch on the freewheel FET.

16. A driver according to claim 10, wherein the high side driver FETs include a control FET and a freewheel FET each having a source and a drain, the control FET and freewheel FET being connected in series between the battery terminal and the output terminal, the sources and drains of the control and freewheel FETs being arranged reversely so that current flowing through the control and freewheel FETs in series flows from source to drain in one of the control and freewheel FETs and from drain to source in the other.

17. A driver according to claim 16, wherein the low side driver FET or FETs and the control FET are integrated on the common substrate, and the drain of the freewheel FET is isolated from the common substrate.

18. A driver according to claim 1 incorporated into a single package with a second driver that shares the battery and ground terminals, the second driver including a second output terminal for driving a second coil, a second energise FET, a second control FET and a second freewheel FET each having respective sources, gates and drains, the second energise FET being connected with source and drain between the second output terminal and the ground terminal, and the second control FET and second freewheel FET being connected in series between the battery terminal and the second output terminal, the sources and drains of the second control and second freewheel FETs being arranged reversely so that current flowing through the second control and second freewheel FETs in series flows from source to drain in one of the second control and second freewheel FETs and from drain to source in the other.

* * * * *